United States Patent [19]
Ferraiolo et al.

[11] Patent Number: 5,724,008
[45] Date of Patent: Mar. 3, 1998

[54] PHASE-LOCKED LOOP WITH CHARGE DISTRIBUTION

[75] Inventors: Frank David Ferraiolo, Essex Junction; John Edwin Gersbach, Burlington; Charles Joseph Masenas, Essex Junction, all of Vt.

[73] Assignee: International Business Machines Corporation, Armonk, N.Y.

[21] Appl. No.: 641,862

[22] Filed: May 2, 1996

[51] Int. Cl.$^6$ ................................................ H03L 7/093
[52] U.S. Cl. .......................... 331/17; 331/14; 331/17; 327/157
[58] Field of Search ..................... 331/14, 17; 327/156, 327/157

[56] References Cited

U.S. PATENT DOCUMENTS

| | | | |
|---|---|---|---|
| 3,619,804 | 11/1971 | Mears | 331/8 |
| 4,310,805 | 1/1982 | Hackert et al. | 331/1 |
| 4,536,718 | 8/1985 | Underhill | 331/16 |
| 4,635,000 | 1/1987 | Swanberg | 331/10 |
| 5,047,733 | 9/1991 | Nonaka et al. | 331/14 |
| 5,170,130 | 12/1992 | Ichihara | 328/155 |
| 5,371,425 | 12/1994 | Rogers | 327/3 |
| 5,387,200 | 2/1995 | Kronstadt | 604/290 |
| 5,406,590 | 4/1995 | Miller et al. | 375/376 |
| 5,475,326 | 12/1995 | Masuda | 327/157 |
| 5,552,727 | 9/1996 | Nakao | 327/159 |
| 5,559,474 | 9/1996 | Matsumono et al. | 331/17 |

FOREIGN PATENT DOCUMENTS 5-304490  11/1993  Japan ............... H04B 1/28

OTHER PUBLICATIONS

Ewen, J. F., Feed-Forward Compensation Circuit For Digital Random-Walk Filters, *IBM Technical Disclosure Bulletin*, Dec. 1988, pp. 455–458.

*Primary Examiner*—Timothy P. Callahan
*Assistant Examiner*—An T. Luu
*Attorney, Agent, or Firm*—Schmeiser, Olsen & Watts; Tiffany Townsend, Esq.

[57] ABSTRACT

According to the preferred embodiment, an improved feedforward path is provided that improves the frequency response and reduces the output jitter of a phase-locked loop. Specifically, the frequency response is improved by providing a zero in the frequency response of the phase-locked loop by means of a feedforward path. The feedforward path delivers a feedforward charge to the oscillator of the phase-locked loop. According to the preferred embodiment, the feedforward path reorders the feedforward charge, such that the feedforward charge is stored and distributed equally across all the phase-locked loop output signal sub-cycles.

15 Claims, 5 Drawing Sheets

PHASE-LOCKED LOOP WITH CHARGE DISTRIBUTION

BACKGROUND OF THE INVENTION

1. Technical Field

This invention generally relates to semiconductor devices, and more specifically relates to phase-locked loops.

2. Background Art

Phase-locked loops (PLLs) are used a wide variety of applications in semiconductor devices. For example, PLLs are used in clock generators, frequency multipliers, frequency synthesizers and servo systems in disk drives. Naturally, in all of these and other applications the accuracy and reliability of the PLL is of critical importance.

Turning to FIG. 1, FIG. 1 is a schematic view of a prior-art phase-locked loop 100. PLL 100 comprises a phase comparator 102, a charge pump 104, a filter 106, a voltage-to-current converter 108, a current-controlled oscillator (ICO) 110, an output circuit 112, and a feedback divider 114.

The general operation of PLL's is well known, so only a brief explanation will be given. The PLL receives an input signal, and outputs an output signal phase aligned to the input signal. Typically, the output clock signal has a frequency which is an integer multiple of the input signal. Thus, for every input signal cycle, there are multiple output signal cycles, or output sub-cycles.

The specific operation of a PLL is as follows. First, phase comparator 102 compares the phase of the input signal (REF) to a feedback signal from feedback divider 114. Depending upon the phase difference between the input signal and feedback signal, phase comparator 102 drives charge pump 104. The output of charge pump 104 is filtered by filter 106, and is used to drive voltage-to-current converter 108. Voltage-to-current converter 108 outputs a current that is proportional to the input voltage. The output current from voltage-to-current converter 108 is used to drive ICO 110, thereby controlling the frequency of the output of ICO 110.

The output of ICO 110 is buffered by output circuit 112, converting the differential output signal to a single-ended output, which is then outputted and fed back through feedback divider 114 to phase comparator 102. This creates the feedback that facilitates the phase-locked loop operation. The feedback divider 114 facilitates comparison of the high frequency PLL output signal with the input signal by phase comparator 102.

Thus, the PLL operates by comparing the input signal phase to the feedback signal phase and eliminating any detected phase difference between the two by adjusting the oscillating frequency of ICO 110.

To improve frequency response in the PLL and to insure loop stability, it is typically required to have a zero in the frequency response of filter 106. This zero provides a quick path from the output of charge pump 104 to the ICO input. Prior art PLLs have typically employed resistors in filter 106 to create one or more zeros in the frequency response. With a resistor in filter 106 a change can quickly be transmitted from the charge pump to V-to-I converter 108. Unfortunately, the use of resistors in filter 106 has numerous disadvantages. Namely, the resistors require an inordinate amount of space in the phase lock loop and are difficult and expensive to manufacture to close tolerances using conventional CMOS processes.

Therefore, what is needed is a method for improving the frequency response of a phase-locked loop while maintaining the accuracy of the phase-locked loop.

DISCLOSURE OF INVENTION

According to the present invention, an improved feedforward path is provided that improves the frequency response of a phase-locked loop. Specifically, the frequency response is improved by providing a zero in the phase-locked loop by means of a feedforward path. The feedforward path delivers a feedforward charge to the oscillator of the phase-locked loop. According to the preferred embodiment, the feedforward path reorders the feedforward charge, such that the feedforward charge is stored is distributed equally across all the phase-locked loop output signal sub-cycles.

The foregoing and other objects, features and advantages of the invention will be apparent from the following more particular description of a preferred embodiment of the invention, as illustrated in the accompanying drawings.

BRIEF DESCRIPTION OF DRAWINGS

The preferred exemplary embodiment of the present invention will hereinafter be described in conjunction with the appended drawings, where like designations denote like elements, and.

BEST MODE FOR CARRYING OUT THE INVENTION

Phase-locked loops (PLLs) are used in a variety of device applications. In all of these applications the accuracy of the PLL is of critical importance. The accuracy of the PLL depends to a great extent on the frequency response of the loop in the PLL. Specifically, it is desirable that there be a zero in the filter frequency response.

Figure 1:
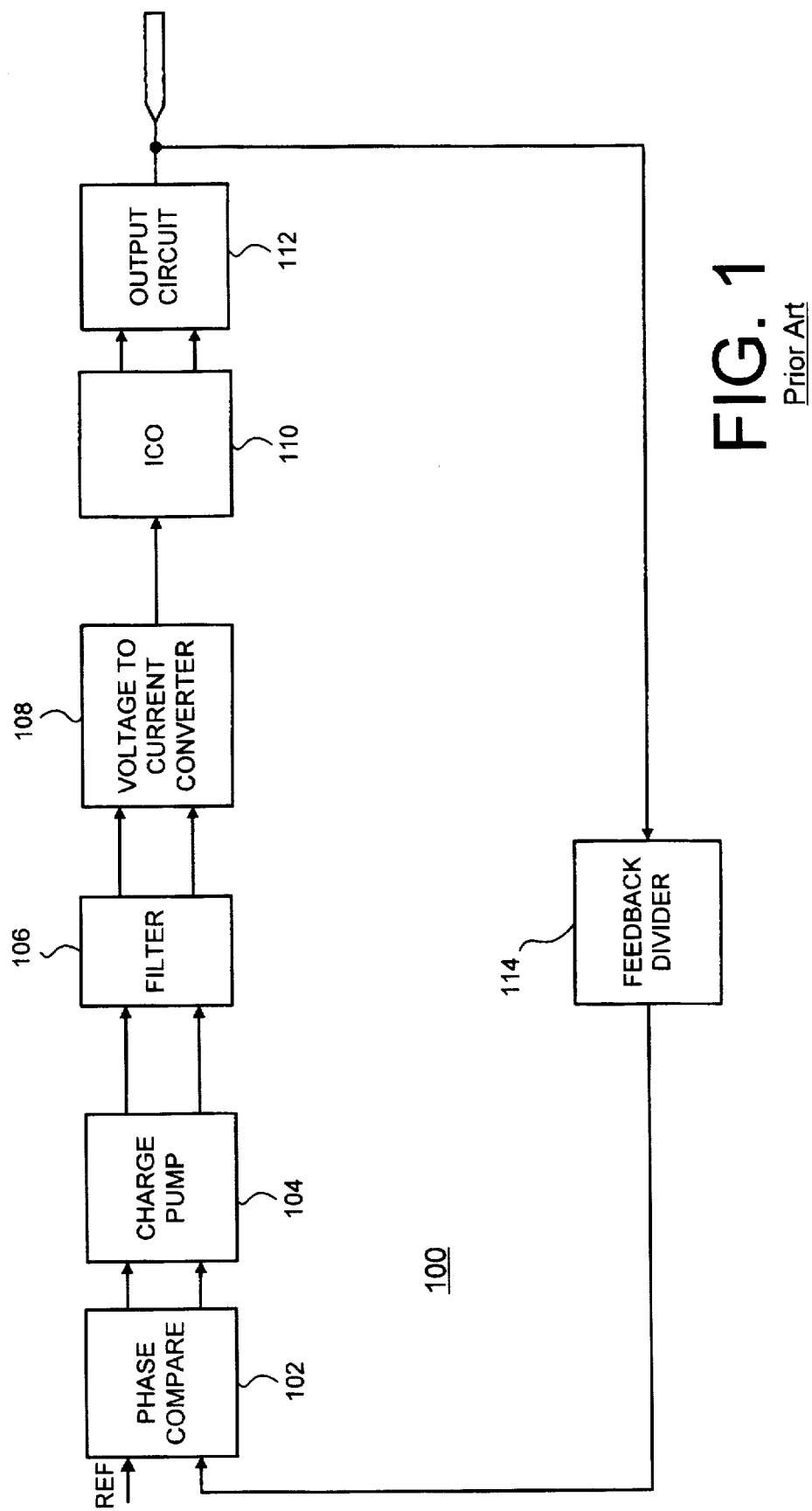
FIG. 1 is a schematic view of a prior art phase-locked loop device.
Figure 2:
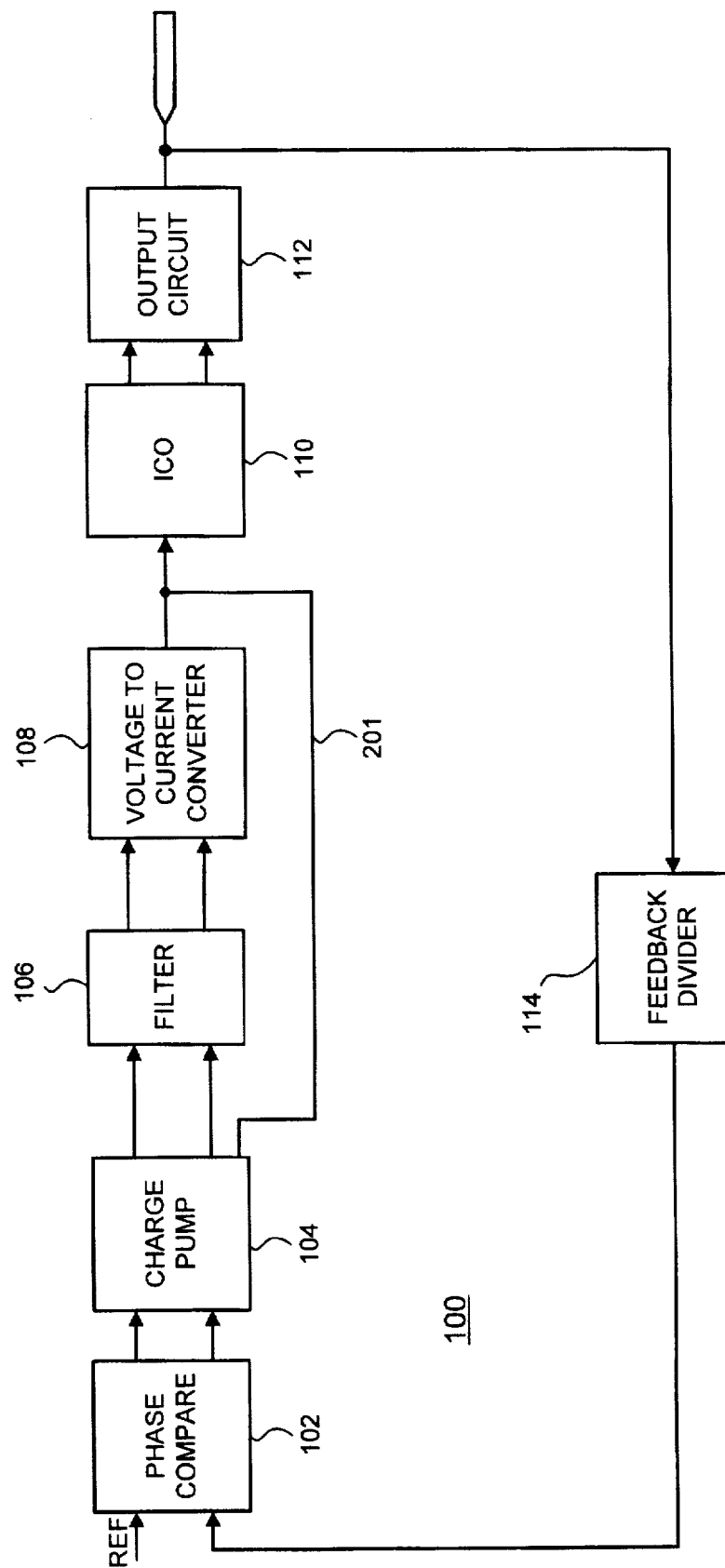
FIG. 2 is a schematic view of a phase-locked loop device.

Turning now to FIG. 2, one method of providing the effect of a zero in the filter frequency response uses a feedforward path 201 from charge pump 104 directly to the ICO 110. The feedforward path 201 gives the same effect as prior art filters that use resistors in the filter, without requiring the extra process steps or excessive amount of space on the semiconductor device that resistors would require. Thus, when there is a detected phase difference the charge pump output causes a fairly immediate change in the ICO 110 frequency. Thus, the feedforward path 201 eliminates the need for the resistor in the filter.

Unfortunately, having a zero in the PLL provided by either a resistor or feedforward path 201 has the disadvantage of a non-uniform charge input provided to the ICO 110. Specifically, the feedforward path provides a charge at the reference clock edge of the input signal, with that charge decaying according to the input time constant of ICO 110. This occurs once for each cycle of the input signal. Because there are multiple output signal cycles (sub-cycles) for each input signal cycle, the charge distributed to the ICO over the feedforward path is not uniform with respect to output signal sub-cycles. This variation in the charge distributed to ICO fluctuates the frequency of the output signal sub-cycles, creating undesirable frequency variation.

Figure 3:
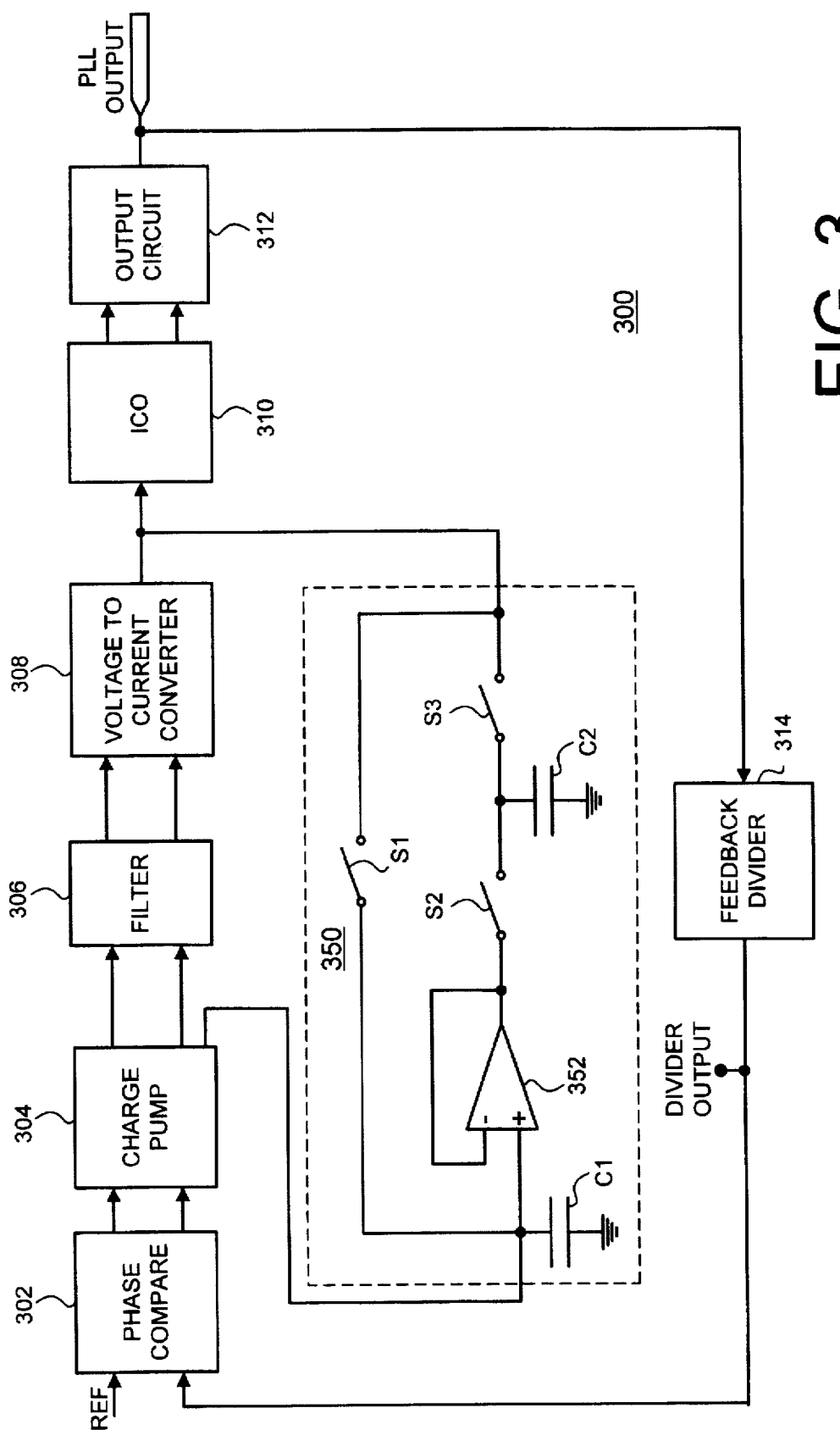
FIG. 3 is a schematic view of a phase-locked loop device in accordance with the preferred embodiment.

Turning now to FIG. 3, FIG. 3 is a schematic view of a PLL 300 with an improved feedforward path in accordance with the preferred embodiment of the present invention. Specifically, PLL 300 has a feedforward path 350 that reorders the feedforward charge, such that the charge is saved by a capacitor and distributed equally across all the output signal sub-cycles. Reordering the feedforward charge improves the frequency response and reduces the output jitter of the PLL 300.

PLL 300 comprises a phase comparator 302, a charge pump 304, a filter 306, a voltage-to-current (V-to-I) converter 308, a current controlled oscillator (ICO) 310, an output circuit 312, and a feedback divider 314.

Phase comparator 302 compares an input signal (REF) to a feedback signal from feedback divider 314. Depending upon the phase difference between the input signal and feedback signal, phase comparator 302 drives charge pump 304. The output of charge pump 304 is filtered by filter 306, and is used to drive voltage-to-current (V-to-I) converter 308. V-to-I converter 308 outputs a current that is proportional to the voltage difference at its inputs. The output current of V-to-I converter 308 is used to drive ICO 310, controlling the frequency of the ICO 310 output.

PLL 300 additionally comprises an improved feedforward path 350. The feedforward path 350 includes a first capacitor C1, a second capacitor C2, an amplifier 352, a first switch S1, a second switch S2, and a third switch S3. The capacitors C1 and C2 serve as a charge storage mechanism for the feedforward path 350. The switches S1, S2 and S3 serve as a switch mechanism and are preferably N-FET switches, with their respective gates tied to control inputs and with their sources and drains tied to the input and output of the switch, respectively. Thus, when their control inputs are high, the switches are closed and current can flow between their input and output. When their control inputs are low the switch is open and current cannot flow. The amplifier 352 is preferably an operational amplifier configured to have a substantially unity gain. Thus configured, a charge equal that stored on C1 is stored on C2 when switch S2 is closed.

During the operation of the PLL 300, the feedforward path 350 provides a zero in the frequency response of the PLL by providing a direct path for feedforward charge from charge pump 304 to the ICO 310 input. Additionally, the feedforward path 350 distributes the feedforward charge to ICO 310 equally for each PLL output signal sub-cycle. Specifically, on each input signal cycle, the charge pump will source or sink a charge depending upon the phase difference detected by phase comparator 302. The feedforward path 350 will repeat and deliver that charge directly to the ICO 310 input for each PLL output signal sub-cycle.

Figure 4:
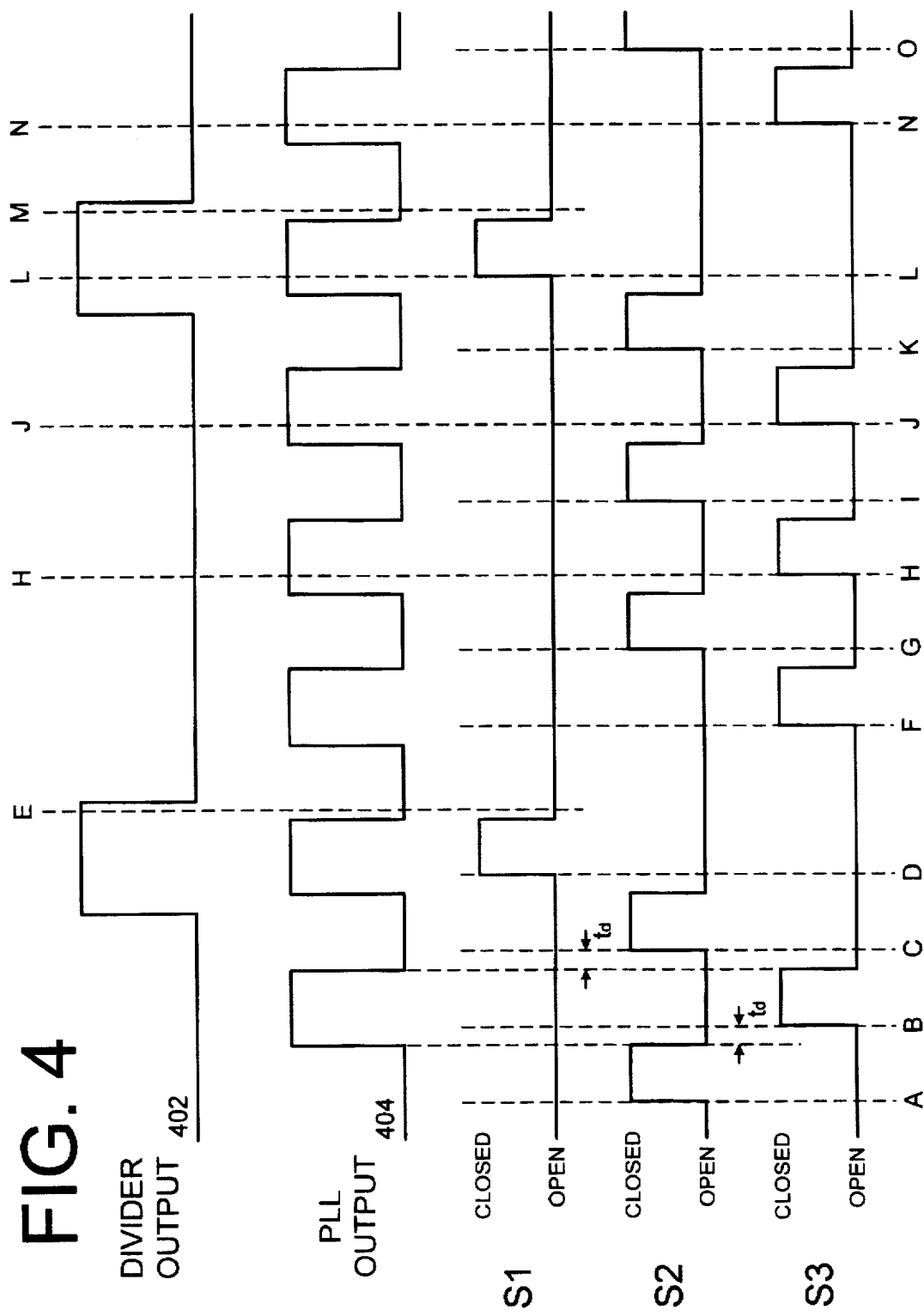
FIG. 4 is a timing diagram in accordance with the preferred embodiment.

Turning now to FIG. 4, FIG. 4 is a timing diagram of waveforms and switch positions of PLL 300 including a feedforward path 350 in accordance with the preferred embodiment. The waveforms illustrated include the feedback divider 314 output waveform 402. The signals from the feedback divider 314 output are used to gate phase comparator 302 and likewise are used to control the switches of feedforward path 350. For each feedback divider 314 output cycle (and thus for each input signal cycle) there are multiple PLL output sub-cycles, as illustrated by waveform 404. In FIG. 4, there are four output sub-cycles for each input signal cycle. Of course, this is for illustration purposes only and the preferred embodiment could easily be used for PLLs with different ratios.

Also illustrated in FIG. 4 are the various switch positions during feedforward operation, including the positions of switches S1, S2 and S3. An important feature of the switches S1, S2 and S3 is that they operate in a break before make fashion. Thus, a switch always opens before the next switch closes.

During the operation of PLL 300, the feedforward path 350 operates as illustrated in FIG. 4. The switch positions and waveforms illustrated in FIG. 4 assume feedforward path 350 has already cycled through at least once and a feedforward charge is stored on C1. Assuming this is the case, at point A in the timing diagrams S2 closes. While S2 is closed amplifier 352 charges C2 to a charge potential equal that of C1. At point B, after S2 has opened again, S3 closes, delivering the charge stored at C2 to the ICO 310 input.

At point C, after S3 has opened again, S2 closes. While S2 is closed, amplifier 352 charges C2 to a charge potential equal that of C1. At point D, after S2 has opened again, S1 closes. This delivers the charge from C1 to the input of ICO 310.

After point D, while S1 is still closed and after C1 has distributed its stored charge to the ICO 310 input, C1 stabilizes to the ICO 310 quiescent input charge. The ICO 310 quiescent input charge is the charge provided by the V-to-I convertor 308 output depending upon the current operating frequency. Thus, the charge at C1 at this point is a "neutral charge" or "net-zero charge," i.e., a reference charge for the feedforward path. When S1 opens, C1 will store this neutral charge.

For each PLL input signal/divider output cycle the charge pump will source or sink a phase-difference charge depending upon the phase difference detected by phase comparator 302. This phase-difference charge adds or removes charge from C1, which was previously at neutral charge. Thus, at point E, due to a detected phase difference in a reference edge, the charge pump 304 sources or sinks charge from C1. This new charge stored on C1 is the feedforward charge for the next set of output sub-cycles corresponding to the phase difference detected at point E. In particular, the amplifier 352 is such that whatever charge is placed on C1 stays there until S1 is closed again. Thus, this feedforward charge stored on C1 at point E will be delivered to the ICO 310 input for each of the four output sub-cycles which comprise the next set of sub-cycles.

At point F, S3 closes and the charge that was stored on C2 at point C is delivered to the input of IC0 310. This is the last feedforward charge delivery to ICO 310 for the previous input cycle. Again, the charge delivered for the next four sub-cycles will correspond to the feedforward charge that was stored on C1 at point E.

At point G, after S3 has opened again, S2 closes. While S2 is closed amplifier 352 charges C2 to a charge potential equal that of C1. At point H, after S2 has opened again, S3 closes and the charge stored on C2 is delivered to the ICO 310 input. Thus, on the first output sub-cycle corresponding to the phase difference detected at point E, a feedforward charge equal to that stored on C1 is stored on C2 and then delivered to the ICO 310 input.

At point I, after S3 has opened again, S2 closes. While S2 is closed amplifier 352 charges C2 to a charge potential equal that of C1. At point J, after S2 has opened again, S3 closes and the charge stored on C2 is delivered to the ICO 310 input. Thus, on the second output sub-cycle corresponding to the phase difference detected at point E, the feedforward charge is again delivered to the ICO 310 input.

At point K, after S3 has opened again, S2 closes. While S2 is closed, amplifier 352 charges C2 to a charge potential equal that of C1.

At point L, after S2 has opened again, S1 closes. With S1 closed, the charge from C1 is delivered to the input of ICO 310. Thus, on the third output sub-cycle, the feedforward charge is delivered to ICO 310 directly from C1. Additionally, while S1 is still closed and after C1 has distributed its stored charge to the ICO 308 input, C1 again stabilizes to the ICO 310 quiescent input charge. Thus, when S1 opens, C1 will store this neutral charge.

At point M, due to a detected phase difference in a reference edge, the charge pump 304 again sources or sinks charge from C1. Again, this new feedforward charge stored on C1 will be delivered to the ICO 310 input at each of the four output sub-cycles which comprise the next set of sub-cycles.

At point N, S3 closes and the charge stored on C2 is delivered to the ICO 310 input. Thus, on the fourth and final output sub-cycle corresponding to the phase difference detected at point E, the original charge is delivered again to ICO 310 input from C2.

At point 0, after S3 has opened again, S2 closes. While S2 is closed amplifier 352 charges C2 to a charge potential equal that of C1.

This general process continues, delivering a substantially equal feedforward charge to the ICO 310 input for each sub-cycle of the PLL output clock that corresponds to a particular input clock cycle. Thus, the feedforward charge provided by charge pump 304 on the input clock signal at point E is distributed to the ICO at points H, J, L and N, once for each of the PLL output sub-cycles. This eliminates the PLL variation present where the feedforward charge is delivered once per input single cycle. It should be noted that the previously described embodiment is one of many ways the switches and capacitors could be configured to reach this result.

Specifically, it should also be noted that while in the illustrated embodiment the feedforward charge is delivered directly from C1 on third output subcycle and delivered from C2 on the other output subcycles, that is merely one of many ways in which the feedforward charge could be distributed. As examples, the feedforward charge could be delivered directly from C1 on a different output subcycle, the feedforward charge can be delivered from C2 directly for all output subcycles, or C2 could be eliminated and all charge delivered from C1 for all output subcycles. Each of these and other embodiments are considered within the scope of the present invention.

Figure 5:
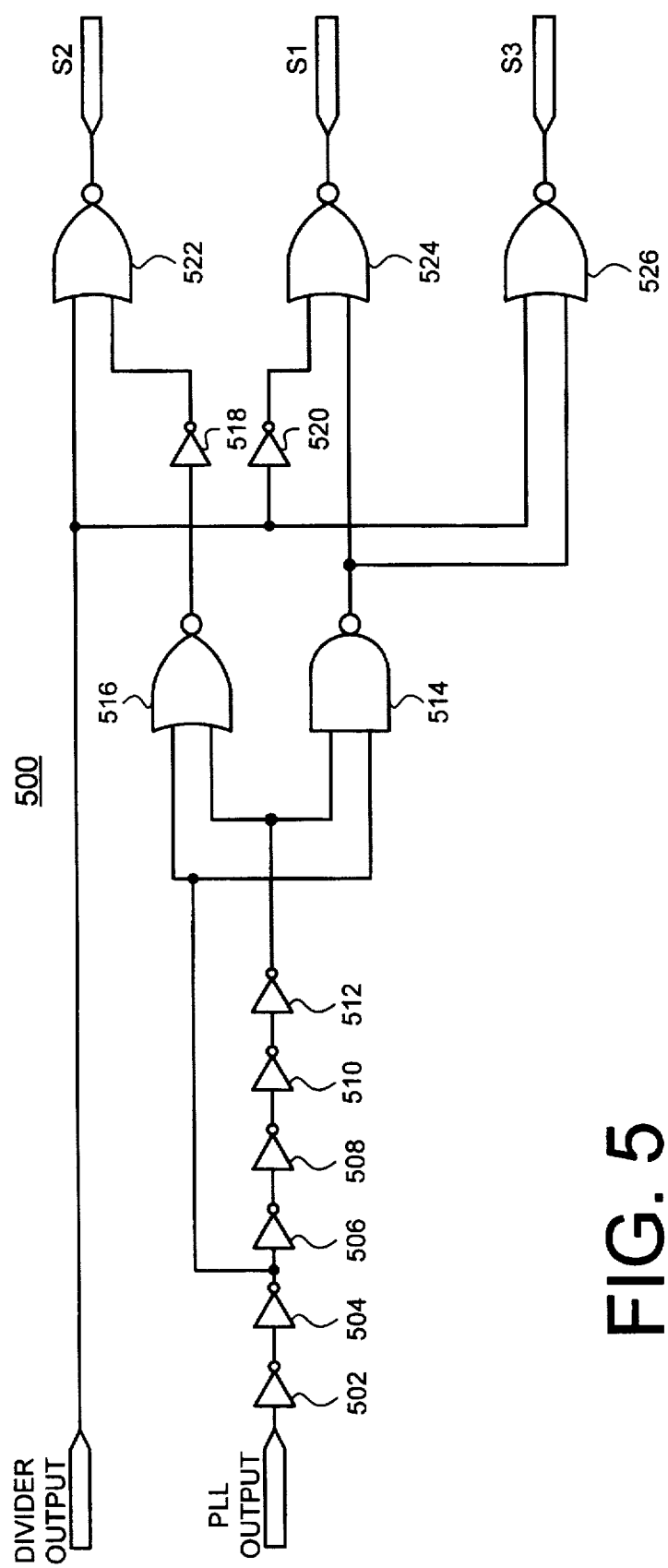
FIG. 5 is a logic diagram of a control circuit in accordance with the preferred embodiment.

Turning now to FIG. 5, FIG. 5 is a logic diagram of a control circuit 500 for a feedforward path in accordance with a preferred embodiment of the present invention.

Control circuit 500 is designed to control switches S1, S2 and S3 of FIG. 3 such that their operation is as illustrated in FIG. 4. Specifically, the control circuitry 500 inputs the feedback divider 314 output and the PLL output signals, and outputs control signals that control switches S1, S2 and S3. Where the switches S1, S2 and S3 are N-FET switches, the switches will be closed when S1, S2 and S3 outputs are respectively high.

Control circuit 500 includes inverters 502–512, NAND gate 514, NOR Gate 516, inverter 518, inverter 520, NOR gate 522, NOR gate 524, and NOR gate 526. The general operation of the control circuitry is such that the switches S1, S2 and S3 are break before make, i.e., the first switch opens before the next switch closes. When the divider output is low and the PLL output goes high, the output of NOR gate 516 will fall, causing the output of NOR gate 522 to fall, thereby opening S2. After a delay $t_d$ (FIG. 4) equal to the propagation delay through invertors 506–512, the output of NAND gate 514 will fall, causing the output of NOR gate 526 to go high, which closes S3, thereby delivering the feedforward charge to the oscillator input from C2. Then when the PLL output goes low, the output of NAND gate 514 will rise, causing S3 to open. After a delay $t_d$ equal to the propagation delay through invertors 506–512, the output of NOR gate 516 will rise, causing S2 to close and charging C2 again. This process is continued, delivering feedforward charge to the oscillator input from C2

When the divider output is high, instead of the S3 closing and opening, S1 will close and open in like manner. Specifically, when the PLL output goes high, the output of NOR gate 516 will fall, causing S2 to open. After a delay $t_d$ equal to the propagation delay through invertors 506–512, the output of NAND gate 514 will fall, causing S1 to close and delivering the feedforward charge to the oscillator input from C1, and then charging C1 to the neutral charge. Then when the PLL output goes low, the output of NAND gate 514 to rise, causing S1 to open. After a delay $t_d$ equal to the propagation delay through invertors 506–512, the output of NOR gate 516 will rise, causing S2 to close and charging C2 again.

Inverters 502–512 create delay between the falling edge of the output of NOR gate 516 and the falling edge of the output of NAND gate 514. Likewise, there is a delay between the rising edge of the output of NAND gate 514 and the rising edge of the output of NOR gate 516. These delays assure that the switches always operate in a break before make fashion.

Thus, control circuit 500 is configured such that the feedforward charge is delivered to the oscillator input for each output subcycle. When the divider output is low, the feedforward charge is delivered from C2. When the divider is high, the feedforward charge is delivered directly from C1.

While the invention has been particularly shown and described with reference to a preferred exemplary embodiment thereof, it will be understood by those skilled in the art that various changes in form and details may be made therein without departing from the spirit and scope of the invention. It will be also understood that, while various of the conductors are shown in the drawing as single lines, they are not so shown in a limiting sense, and may comprise plural conductors, as is understood in the art.

We claim:

1. A feedforward path for a phase-locked loop, wherein said phase-locked loop includes a charge pump and an oscillator, said feedforward path comprising:

a) a first charge storage mechanism, said first charge storage mechanism receiving a charge from said charge pump;

b) a switch mechanism, said switch mechanism distributing said charge from said first charge storage mechanism to said oscillator for each output cycle of said oscillator.

2. The device of claim 1 further comprising a second charge storage mechanism coupled to said switch mechanism.

3. The device of claim 2 wherein said first and second charge storage mechanisms comprise a first and second capacitor.

4. A feedforward path for a phase-locked loop, wherein said phase-locked loop includes a charge pump and an oscillator, said feedforward path comprising:.

a) a first charge storage mechanism, said first charge storage mechanism receiving a charge from said charge pump;

b) a switch mechanism, said switch mechanism distributing said charge to said oscillator for each output cycle of said oscillator, wherein said switch mechanism comprises at least a first switch, a second switch and a third switch.

5. The device of claim 4 wherein said first switch, said second switch and said third switch each comprise a FET switch.

6. A feedforward path for a phase-locked loop, wherein said phase-locked loop includes a current controlled oscillator and a charge pump, wherein said phase-locked loop receives an input signal and outputs an output signal, said feedforward path connecting the output of said charge pump to the input of said current controlled oscillator, said feedforward path comprising:

a) a first capacitor, said first capacitor connected to said charge pump output;

b) a first switch, said first switch connected between said first capacitor and said current controlled oscillator input;

c) an amplifier, said amplifier including an output and an input, said input connected to said first capacitor;

d) a second capacitor;

e) a second switch; said second switch connected between said amplifier output and said second capacitor; and f) a third switch, said third switch connected between said second capacitor and said current controlled oscillator input.

7. The phase-locked loop of claim 6 wherein said first, second and third switch each comprise an N-FET switch.

8. The phase-locked loop of claim 6 wherein said amplifier comprises an amplifier having substantially unity gain.

9. The phase-locked loop of claim 6 wherein said first, second, and third switches are operated in a break before make fashion.

10. A method for improving the frequency response of a phase-locked loop, wherein said phase-locked loop includes a charge pump and an oscillator, wherein the charge pump provides a phase-difference charge in response to a detected phase difference, the method comprising the steps of:

a) storing a feedforward charge, said feedforward charge including a charge substantially equal to said phase-difference charge;

b) delivering a charge substantially equal to said feedforward charge to said oscillator for each output cycle of said oscillator.

11. The method of claim 10 wherein the step of storing a feedforward charge includes storing a neutral charge.

12. The method of claim 10 wherein the step of delivering a charge substantially equal to said feedforward charge comprises delivering said feedforward charge to said oscillator for one of said output signal cycles of said oscillator.

13. The method of claim 12 wherein the step of delivering a charge substantially equal to said feedforward charge comprises the steps of:

delivering said feedforward charge to said oscillator for other of said output cycles, said delivering for other output cycles including storing a second feedforward charge substantially equal to said feedforward charge in a second charge storage mechanism and delivering said second feedforward charge to said oscillator for each of other output cycles.

14. A method for improving the frequency response of a phase-locked loop, the phase-locked loop inputting an input signal and outputting an output signal, said output signal having multiple cycles for each input signal cycle, wherein said phase-locked loop includes a charge pump and an oscillator, and wherein said charge pump provides a phase-difference charge in response to a detected phase difference, the method comprising the steps of:

storing a neutral charge and said phase-difference charge in a first charge storage mechanism, said stored charge comprising a feedforward charge;

delivering said feedforward charge to said oscillator for one of said output signal cycles of said oscillator; and delivering said feedforward charge to said oscillator for other of said output cycles, said delivering for other output cycles including storing a second feedforward charge substantially equal to said feedforward charge in a second charge storage mechanism and delivering said second feedforward charge to said oscillator for each of other output cycles.

15. The method of claim 14 wherein said step of delivering said feedforward charge to said oscillator for one of said output signal cycles of said oscillator comprises delivering said feedforward charge directly to said oscillator.

\* \* \* \* \*

UNITED STATES PATENT AND TRADEMARK OFFICE
CERTIFICATE OF CORRECTION

PATENT NO. : 5,724,008
DATED : March 3, 1998
INVENTOR(S) : Ferraiolo et al.

It is certified that error appears in the above-indentified patent and that said Letters Patent is hereby corrected as shown below:

TITLE PAGE:

Under Other Publications, the Attorney, Agent or Firm listing "Tiffany Townsend, Esq." should read--Susan Murray, Esq.--

Signed and Sealed this

Seventh Day of July, 1998

Attest:

BRUCE LEHMAN

Attesting Officer

Commissioner of Patents and Trademarks